(12) United States Patent
Herceg et al.

(10) Patent No.: US 12,123,787 B2
(45) Date of Patent: Oct. 22, 2024

(54) SEMICONDUCTOR BASED TEMPERATURE SENSOR (71) Applicant: Nokia Technologies Oy, Espoo (FI)

(72) Inventors: Marijan Herceg, Osijek (HR); Tomislav Matic, Osijek (HR)

(73) Assignee: NOKIA TECHNOLOGIES OY, Espoo (FI)

( * ) Notice: Subject to any disclaimer, the term of this patent is extended or adjusted under 35 U.S.C. 154(b) by 583 days.

(21) Appl. No.: 17/145,867

(22) Filed: Jan. 11, 2021

(65) Prior Publication Data

US 2021/0215547 A1    Jul. 15, 2021

(30) Foreign Application Priority Data

Jan. 13, 2020    (GB) .................................... 2000435

(51) Int. Cl.
    *G01K 7/01*    (2006.01)
    *G01K 3/00*    (2006.01)
    (Continued)

(52) U.S. Cl.
    CPC .......... *G01K 7/01* (2013.01); *H03F 3/45475* (2013.01); *G01K 3/00* (2013.01); *G01K 7/34* (2013.01);
    (Continued)

(58) Field of Classification Search
    CPC ........ G01K 2217/00; G01K 7/01; G01K 7/34; G01K 7/22; G01K 3/00; H03F 3/45475;
    (Continued)

(56) References Cited

U.S. PATENT DOCUMENTS 5,982,221 A * 11/1999 Tuthill .................... H01L 23/34
                                                          327/512
9,970,825 B2 * 5/2018 Zanbaghi ................. G01K 7/01
(Continued)

FOREIGN PATENT DOCUMENTS

CN      1831500 A    9/2006
CN    102998017 A    3/2013
(Continued)

OTHER PUBLICATIONS

Timiko, Michael. "A Two-Terminal IC Temperature Transducer" IEEE Journal of Solid-State Circuits, vol. SC-11, No. 6, Dec. 1976 (Year: 1976).*

(Continued)

*Primary Examiner* — Manish S Shah
*Assistant Examiner* — Christian T Bryant
(74) *Attorney, Agent, or Firm* — ALSTON & BIRD LLP (57) ABSTRACT

An apparatus may include a transistor, a capacitor, and an operational amplifier. The transistor may have a sub-threshold voltage applied to a gate of the transistor. The capacitor configured to store a first gate-to-source voltage of the transistor while a first switch and a second switch are closed and a third switch is open. The capacitor may be charged to a first gate-to-source voltage of the transistor while the transistor is biased with a first bias current. The operational amplifier may be configured to determine a voltage difference between the first gate-to-source voltage stored in the capacitor and a second gate-to-source voltage of the transistor while the transistor is biased with a second bias current. The operational amplifier may determine the voltage difference while the third switch is closed and the first switch and the second switch are open. The voltage difference may correspond to a temperature of the transistor.

19 Claims, 8 Drawing Sheets

(51) Int. Cl.
  *G01K 7/34* (2006.01)
  *H03F 3/45* (2006.01)

(52) U.S. Cl.
  CPC .... *G01K 2217/00* (2013.01); *H03F 2200/129* (2013.01); *H03F 2203/45116* (2013.01); *H03F 2203/45551* (2013.01)

(58) Field of Classification Search
  CPC ..... H03F 2200/129; H03F 2203/45116; H03F 2203/45551
  USPC .......................................................... 374/701
  See application file for complete search history.

(56) References Cited

U.S. PATENT DOCUMENTS

| | | |
|---|---|---|
| 2005/0285662 A1 | 12/2005 | Furuta et al. |
| 2006/0203883 A1 | 9/2006 | Griffin |
| 2011/0291807 A1 | 12/2011 | Law et al. |
| 2013/0060499 A1 | 3/2013 | Yoshimura |
| 2014/0314124 A1 | 10/2014 | Ash et al. |
| 2014/0354308 A1 | 12/2014 | Hong et al. |
| 2015/0204731 A1 | 7/2015 | Corcos et al. |
| 2015/0355033 A1 | 12/2015 | Zhang et al. |
| 2016/0116345 A1 | 4/2016 | Furtner |
| 2017/0045403 A1 | 2/2017 | Zanbaghi et al. |
| 2018/0164163 A1* | 6/2018 | Pandiri ................ G01K 15/005 |
| 2019/0120699 A1 | 4/2019 | Wang |

FOREIGN PATENT DOCUMENTS

| | | | | |
|---|---|---|---|---|
| CN | 103674299 A | 3/2014 | | |
| CN | 104215353 A | 12/2014 | | |
| CN | 105572557 A | 5/2016 | | |
| CN | 106461470 A | 2/2017 | | |
| CN | 107994009 A | 5/2018 | | |
| CN | 108880496 A | * | 11/2018 | ................ G01J 1/46 |
| DE | 102010000875 A1 | 7/2011 | | |
| GB | 2541252 A | 2/2017 | | |
| JP | 3319406 B2 | * | 9/2002 | ................ G01K 7/01 |

OTHER PUBLICATIONS

A. Bakker and J. H. Huijsing, "Micropower CMOS temperature sensor with digital output," in IEEE Journal of Solid-State Circuits, vol. 31, No. 7, pp. 933-937, Jul. 1996, doi: 10.1109/4.508205. (Year: 1996).*

Xie et al., "A CMOS-Imager-Pixel-Based Temperature Sensor for Dark Current Compensation", IEEE Transactions on Circuits and Systems II: Express Briefs, vol. 67, No. 2, Feb. 2020, pp. 255-259.

Jung et al., "An On-Chip Thermal Monitoring System with a Temperature Sensing Area of 52 μm2 in 180-nm CMOS", IEEE Transactions on Circuits and Systems II: Express Briefs, vol. 66, No. 10, Oct. 2019, pp. 1638-1642.

Chen et al., "A time-to-digital-converter-based CMOS smart temperature sensor", IEEE Journal of Solid-State Circuits, vol. 40, No. 8, Aug. 2005, pp. 1642-1648.

Wang et al., "CMOS pulse-width-modulation readout circuit with a wide modulation range for ion-sensitive FET-based sensors", Japanese Journal of Applied Physics, vol. 54, 04DL02, Mar. 2015, p. 04DL02-1-04DL02-6.

Search Report received for corresponding United Kingdom Patent Application No. 2000435.4, dated Jul. 9, 2020, 3 pages.

Office Action for Chinese Application No. 202110035237.3 dated Oct. 28, 2023, 24 pages.

Office Action for Chinese Application No. 202110035237.3 dated Apr. 24, 2024, 22 pages.

* cited by examiner

SEMICONDUCTOR BASED TEMPERATURE SENSOR

TECHNICAL FIELD

The subject matter disclosed herein relates to temperature sensors and more specifically to a semiconductor based temperature sensor.

BACKGROUND

Temperature sensors may be an integral part of a variety of electronic devices. For example, a device may include temperature sensors configured to measure the temperature of one or more internal components such as, for example, a central processing unit (CPU). The operating parameters of the device may be adjusted, for example, the central processing unit may be throttled, in response to anomalous temperature readings. In some instances, the device may also incorporate temperature sensors configured to measure an ambient temperature and/or a temperature of a proximate object. For instance, a wearable device, such as a smartwatch or an activity tracker, may include one or more temperature sensors configured to measure a wearer's body temperature.

SUMMARY

Systems, methods, and articles of manufacture, including apparatuses, are provided for temperature measurement. In one aspect, there is provided an apparatus for temperature sensing. The apparatus may include: a transistor, a capacitor, and an operational amplifier. The capacitor may be configured to store a first gate-to-source voltage of the transistor during a first phase of a measurement cycle. The operational amplifier may be configured to determine a voltage difference between the first gate-to-source voltage stored in the capacitor and a second gate-to-source voltage of the transistor during a second phase of the measurement cycle, the voltage difference corresponding to a temperature of the transistor.

In some variations, one or more of the features disclosed herein including the following features can optionally be included in any feasible combination. The capacitor may be charged to the first gate-to-source voltage of the transistor during the first phase of the measurement cycle. The transistor may be biased with a first bias current during the first phase of the measurement cycle. A first switch and a second switch are closed during the first phase of the measurement cycle. A third switch may be open during the first phase of the measurement cycle.

In some variations, the transistor may be biased with a second bias current during the second phase of the measurement cycle. The third switch may be closed during the second phase of the measurement cycle. The first switch and the second switch may be open during the second phase of the measurement cycle.

In some variations, the first switch and the third switch may be coupled in series to a source terminal of the transistor or a drain terminal of the transistor. The source terminal of the transistor may be coupled in series to a first terminal of the capacitor. The second switch may be disposed between a second terminal of the capacitor and ground.

In some variations, the second terminal of the capacitor may be further coupled in series to an input terminal of the operational amplifier.

In some variations, the capacitor may form a parallel connection with a resistor while the first switch and the second switch are closed.

In some variations, the resistor may be disposed between the transistor and the capacitor. A first port of the resistor may be coupled with the source terminal of the transistor and the first terminal of the capacitor. A second port of the resistor may be coupled to ground.

In some variations, a first port of the resistor may be coupled in series to the drain terminal of the transistor. A second port of the resistor may be coupled in series to a power supply of the apparatus.

In some variations, the transistor may be a metal oxide semiconductor field-effect transistor.

In some variations, a sub-threshold voltage may be applied to between a gate and a source terminal of the transistor. The sub-threshold voltage may be a voltage that is less than a minimum voltage associated with creating a conductive path between the source terminal of the transistor and a drain terminal of the transistor.

In some variations, an output of the operational amplifier may be a pulse amplitude modulated signal. The apparatus may further include an analog to digital converter configured to convert, to a digital signal, the pulse amplitude modulated signal.

In some variations, the digital signal may be sent, via a wired connection and/or a wireless connection, to a controller of a device. The digital signal may be sent to the controller to at least enable the controller to determine, based at least on the digital signal, one or more temperatures of the transistor and generate, based at least on the one or more temperatures, a control signal configured to control an operation of the device.

In another aspect, there is provided a method for temperature measurement. The method may include: storing, by a capacitor, a first gate-to-source voltage of a transistor during a first phase of a measurement cycle; and determining, by an operational amplifier, a voltage difference between the first gate-to-source voltage stored in the capacitor and a second gate-to-source voltage of the transistor during a second phase of the measurement cycle, the voltage difference corresponding to a temperature of the transistor.

In some variations, one or more of the features disclosed herein including the following features can optionally be included in any feasible combination. The method may further include: biasing the transistor with a first bias current during the first phase of the measurement cycle; and biasing the transistor with a second bias current during the second phase of the measurement cycle, the first bias current being greater in magnitude than the second bias current by an integer multiplier.

In some variations, the method may further include converting, by an analog to digital converter, a pulse amplitude modulated signal output by the operational amplifier to a digital signal.

In some variations, the method may further include sending, via a wired connection and/or a wireless connection, the digital signal to a controller of a device. The digital signal may be sent to the controller to at least enable the controller to determine, based at least on the digital signal, one or more temperatures of the transistor and generate, based at least on the one or more temperatures, a control signal configured to control an operation of the device.

In another aspect, there is provided a computer program for temperature measurement. The computer program may include instructions for causing an apparatus to perform at least the following: store, by a capacitor, a first gate-tosource voltage of a transistor during a first phase of a measurement cycle; and determine, by an operational amplifier, a voltage difference between the first gate-to-source voltage stored in the capacitor and a second gate-to-source voltage of the transistor during a second phase of the measurement cycle, the voltage difference corresponding to a temperature of the transistor.

In some variations, one or more of the features disclosed herein including the following features can optionally be included in any feasible combination. The computer program may further include instructions for causing the apparatus to perform the following: bias the transistor with a first bias current during the first phase of the measurement cycle; and bias the transistor with a second bias current during the second phase of the measurement cycle, the first bias current being greater in magnitude than the second bias current by an integer multiplier.

In some variations, the computer program may further include instructions for causing the apparatus to perform at least the following: convert, by an analog to digital converter, a pulse amplitude modulated signal output by the operational amplifier to a digital signal.

In some variations, the computer program may further include instructions for causing the apparatus to perform at least the following: send, via a wired connection and/or a wireless connection, the digital signal to a controller of a device. The digital signal may be sent to the controller to at least enable the controller to determine, based at least on the digital signal, one or more temperatures of the transistor and generate, based at least on the one or more temperatures, a control signal configured to control an operation of the device.

The details of one or more variations of the subject matter described herein are set forth in the accompanying drawings and the description below. Other features and advantages of the subject matter described herein will be apparent from the description and drawings, and from the claims. While certain features of the currently disclosed subject matter are described for illustrative purposes in relation to a semiconductor based temperature sensor, it should be readily understood that such features are not intended to be limiting. The claims that follow this disclosure are intended to define the scope of the protected subject matter.

DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings.

When practical, similar reference numbers denote similar structures, features, and/or elements.

DETAILED DESCRIPTION

A variety of electronic devices may require at least one temperature sensor to measure an ambient temperature, a temperature of an internal component, a temperature of a proximate object, and/or the like. Nevertheless, many devices may impose significant constraints on the size and energy efficiency of the temperature sensor. Accordingly, in some example embodiments, a temperature sensor may be implemented using a transistor including, for example, a metal-oxide semiconductor field-effect transistor (MOSFET) and/or the like. The temperature sensor may perform temperature measurements based at least on a gate-to-source voltage of the transistor. Moreover, the transistor may operate in a sub-threshold region in which the voltage applied between a gate and a source terminal of the transistor is less than a minimum voltage associated with creating a conductive path between the source terminal and the drain terminal of the transistor. Accordingly, the temperature sensor implemented using a transistor operating in a sub-threshold region may be sufficiently small and energy efficient to accommodate a variety of applications including, for example, wearable devices, Internet-of-Things (IoT) devices, and/or the like.

In some example embodiments, the temperature sensor may include a capacitor coupled with a transistor operating in a sub-threshold region. For example, the temperature sensor may include a capacitor coupled with a metal-oxide semiconductor field-effect transistor. Moreover, the temperature sensor may be configured to perform temperature measurement over successive measurement cycles, each of which having two phases, During the first phase of a measurement cycle, the capacitor may be charged to a first gate-to-source voltage of the transistor exhibited by the transistor biased with a first bias current. The transistor may exhibit a second gate-to-source voltage during the second phase of the measurement cycle when the field-effect-transistor is biased with a second bias current that is less than the first bias current.

The voltage difference between the first gate-to-source voltage and the second gate-to-source voltage may exhibit a linear dependence on the temperature of the transistor. Accordingly, in some example embodiments, the temperature sensor may also include an operational amplifier configured to determine, during the second phase of the measurement cycle, the voltage difference between the first gate-to-source voltage stored in the capacitor and the second gate-to-source voltage exhibited by the transistor biased with the second bias current. The temperature sensor may further include an analog-to-digital converter (ADC) configured to convert, to a digital signal, an analog signal corresponding to the voltage difference between the first gate-to-source voltage and the second gate-to-source voltage. For instance, the analog-to-digital converter may be configured to convert, to a digital signal, a pulse-amplitude modulated (PAM) signal corresponding to the voltage difference between the first gate-to-source voltage and the second gate-to-source voltage. A controller may generate, based at least on the digital signal from the analog-to-digital converter, one or more control signals. For example, the controller may determine, based at least on the digital signal, one or more temperature measurements. Moreover, the controller may generate, based on the temperature measurements, control signals to control the operations of a device such as, for example, a wearable device, an Internet-of-Things device, and/or the like.

Figure 1:
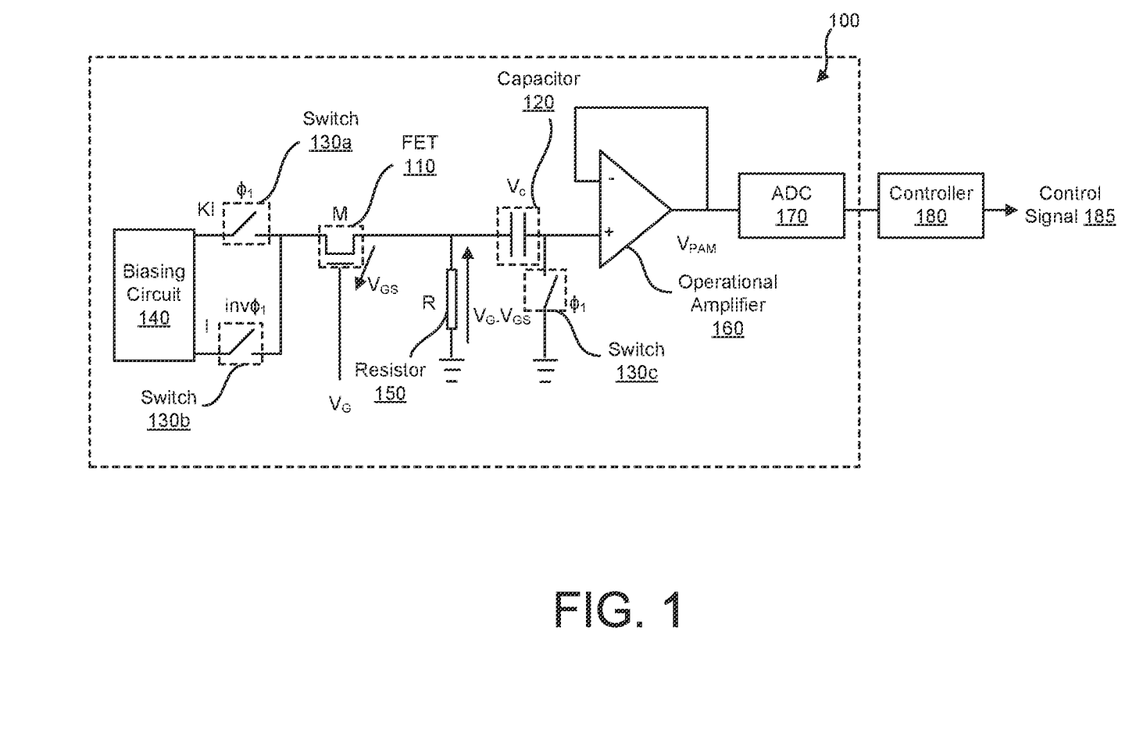
FIG. 1 depicts a schematic diagram illustrating an example of a temperature measurement circuit, in accordance with some example embodiments.

FIG. 1 depicts a schematic diagram illustrating an example of a temperature measurement circuit 100, in accordance with some example embodiments. Referring to FIG. 1, the temperature measurement circuit 100 may include a transistor 110 and a capacitor 120. For example, the transistor 110 may be a field-effect transistor such as, for example, a metal-oxide semiconductor field-effect transistor (MOSFET) and/or the like. The temperature measurement circuit 100 may further include a plurality of switches including, for example, a first switch 130a, a second switch 130b, a third switch 130c, and/or the like. It should be appreciated that each of the first switch 130a, the second switch 130b, and the third switch 130c may be a transistor including, for example, an n-channel field effect transistor (NFET), a p-channel field effect transistor (PFET), and/or the like. As shown in FIG. 1, the state of the first switch 130a and the third switch 130c may be controlled by a first signal $\phi_1$ while the state of the second switch 130b may be controlled by a second signal $inv\phi_1$. For instance, the first switch 130a and the third switch 130c may close (and open) in response to the first signal $\phi_1$ while the second switch 130b may close (and open) in response to the second signal $inv\phi_1$.

In some example embodiments, the temperature measurement circuit 100 may be configured to measure a gate-to-source voltage $V_{GS}$ of the transistor 110, which is directly proportional to the temperature of the transistor 110. In the example of the temperature measurement circuit 100 shown in FIG. 1, the drain terminal of the transistor 110 may be coupled in series with the first switch 130a and the second switch 130b. A resistor 150 may be disposed between the transistor 110 and the capacitor 120. A first port of the resistor 150 may be coupled with a source terminal of the transistor 110 and a first terminal of the capacitor 120 while a second port of the resistor 150 may be coupled to ground. The third switch 130c may be disposed between a second terminal of the capacitor 120 and ground. As shown in FIG. 1, the second terminal of the capacitor 120 may be further coupled in series to an input terminal of an operational amplifier 160 while an output terminal of the operational amplifier 160 is coupled to an analog-to-digital converter (ADC) 170.

The analog-to-digital converter 170 may be communicatively coupled to a controller 180 via a wired connection and/or a wireless connection. Accordingly, the digital signal output by the analog-to-digital converter 170 may be sent to the controller 180 via a wired connection and/or a wireless connection. As shown in FIG. 1, the controller 180 may generate, based at least on the digital signal output by the analog-to-digital converter 170, a control signal 185 configured to control the operations of a device such as, for example, a wearable device, an Internet-of-Things device, and/or the like. In some example embodiments, the digital signal output by the analog-to-digital converter 170 may convey one or more temperature measurements made by the temperature measurement circuit 100.

In some example embodiments, the temperature measurement circuit 100 may be configured to perform temperature measurements, for example, by measuring the gate-to-source voltage $V_{GS}$ of the transistor 110, while the transistor 110 is subject to a sub-threshold voltage. For example, the temperature measurement circuit 100 may perform temperature measurements while a voltage $V_G$ is applied to the gate of the transistor 110. The voltage $V_G$ may be less than a threshold voltage $V_{th}$, which is the minimum voltage associated with creating a conductive path between the source terminal and the drain terminal of the transistor 110.

The temperature measurement circuit 100 may be configured to perform temperature measurements over successive measurement cycles, each of which including two phases. During the first phase of a measurement cycle, a first bias current KI may generate a first gate-to-source voltage $V_{GS1}$ at the transistor 110 while the first switch 130a and the third switch 130c are closed in response to the first signal $\phi_1$. The second switch 130b is open during the first phase of the measurement cycle when the first switch 130a and the third switch 130c are closed. With the first switch 130a and the third switch 130c closed, the capacitor 120 may form a parallel connection with the resistor 150 such that the capacitor 120 may be charged to a voltage corresponding to a difference between the voltage $V_G$ applied at the gate of the transistor 110 and the first gate-to-source voltage $V_{GS1}$ of the transistor 110 (e.g., $V_G$-$V_{GS1}$). Accordingly, at the conclusion of the first phase of the measurement cycle, the voltage $V_G$-$V_{GS1}$ may be stored at the capacitor 120. Furthermore, the output of the operational amplifier 160 may be zero during the first phase of the measurement cycle because the input terminal of the operational amplifier 160 is coupled to ground while the third switch 130c is closed.

During the second phase of the measurement cycle, a second bias current I may generate a second gate-to-source voltage $V_{GS2}$ at the transistor 110 while the second switch 130b is closed in response to the second signal $inv\phi_1$. The second bias current I may be less than the first bias current KI, which may be greater in magnitude than the second bias current I by a multiple of an integer K. That is, the first bias current KI may be greater than the second current I by an integer K multiplier. As used herein, a "bias current" may refer to a current configured to establish a predetermined voltage and/or a predetermined current at various points in an electronic circuit. Accordingly, the first bias current KI may be configured to establish the first gate-to-source voltage $V_{GS1}$ at the transistor 110 while the second bias current I may be configured to establish the second gate-to-source voltage $V_{GS2}$ at the transistor 110.

It should be appreciated that the first switch 130a and the third switch 130c are open during the second phase of the measurement cycle when the second switch 130b is closed. Moreover, due to the high input impedance of the operational amplifier 160, current from the transistor 110 may bypass the capacitor 120 during the second phase of the measurement cycle. Accordingly, the capacitor 120 may retain, during the second phase of the measurement cycle, the voltage $V_G$-$V_{GS1}$ stored in the capacitor 120 during the first phase of the measurement cycle. Meanwhile, as Equation (1) below shows, the output of the operational amplifier $V_{PAM}$ during the second phase of the measurement cycle may be the voltage difference $\Delta V_{GS}$ between the voltage $V_G$-$V_{GS1}$ stored in the capacitor 120 and the second gate-to-source voltage $V_{GS2}$ of the transistor 110.

$$V_{PAM} = V_G - V_{GS2} - V_G + V_{GS1} = V_{GS1} - V_{GS2} = \Delta V_{GS} \quad (1)$$

Figure 4:
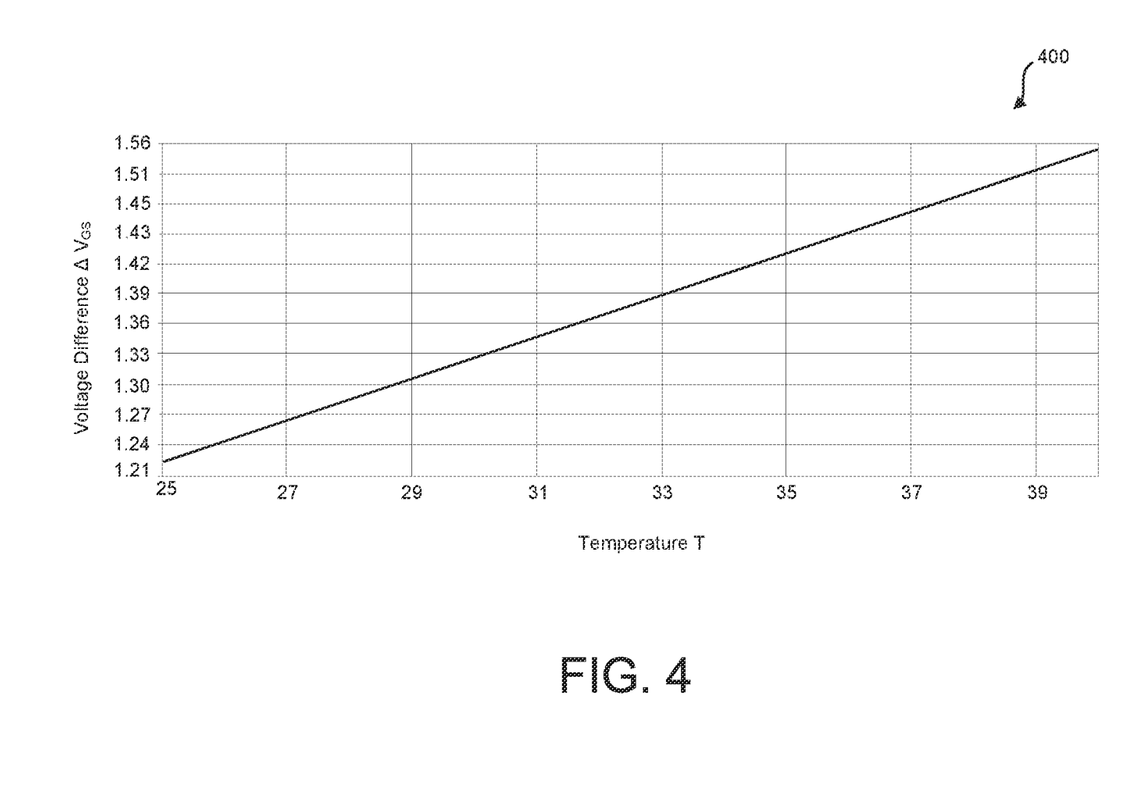
FIG. 4 depicts a graph illustrating a relationship between a temperature and a voltage difference of a transistor, in accordance with some example embodiments.

The temperature T of the transistor 110 while the transistor 110 is subject to a sub-threshold voltage $V_G < V_{th}$ may be directly proportional to the voltage difference $\Delta V_{GS}$ between the first gate-to-source voltage $V_{GS1}$ and the second gate-to-source voltage $V_{GS2}$. To further illustrate, FIG. 4 depicts a graph 400 illustrating the relationship between the voltage difference $\Delta V_{GS}$ and the temperature T of the transistor 110. As shown in FIG. 4, the temperature T of the transistor 110 may be linearly proportional to the voltage difference $\Delta V_{GS}$.

The relationship between the temperature T of the transistor 110 and the voltage difference $\Delta V_{GS}$ may be derived from Equation (2) below, which describes the current-voltage curve of the transistor 110 while the transistor 110 is subject to a sub-threshold voltage $V_G < V_{th}$. Equations (3)-(4) further show the derivation of the linear relationship between the temperature T of the transistor 110 and the voltage difference $\Delta V_{GS}$.

$$J = I_{DS} e^{\frac{V_{GS} - V_{TH}}{nV_T}}, \text{ for } V_{DS} \geq 3V_T \quad (2)$$

$$V_T = \frac{kT}{q} \quad (3)$$

$$\Delta V_{GS} = V_{GS1} - V_{GS2} = n\frac{kT}{q}\ln\left(\frac{KI}{I_{DS}}\right) - n\frac{kT}{q}\ln\left(\frac{I}{I_{DS}}\right) = n\frac{kT}{q}\ln(K) \quad (4)$$

wherein I may denote the bias current applied to the transistor 110, $I_{DS}$ may denote the saturation current, $V_{th}$ may denote a threshold voltage of the transistor 110, k may denote the Botlzmann constant, q may denote an electronic charge, T may denote the temperature of the transistor 110, n may denote a process dependent factor, and K may denote an integer value corresponding to a magnitude difference between the first bias current KI and the second bias current I. It should be appreciated that the second gate-to-source voltage $V_{GS2}$ may be subtracted from the first gate-to-source voltage $V_{GS1}$ in order to eliminate the temperature dependence of the saturation current I Ds for each gate-to-source voltage $V_{GS1}$ and $V_{GS2}$.

Operational amplifier and amplifier can be used interchangeably in this application. An amplifier can be unity gain amplifier or buffer. In another example embodiment, for high impedance ADCs, the amplifier can be excluded.

Figure 2A:
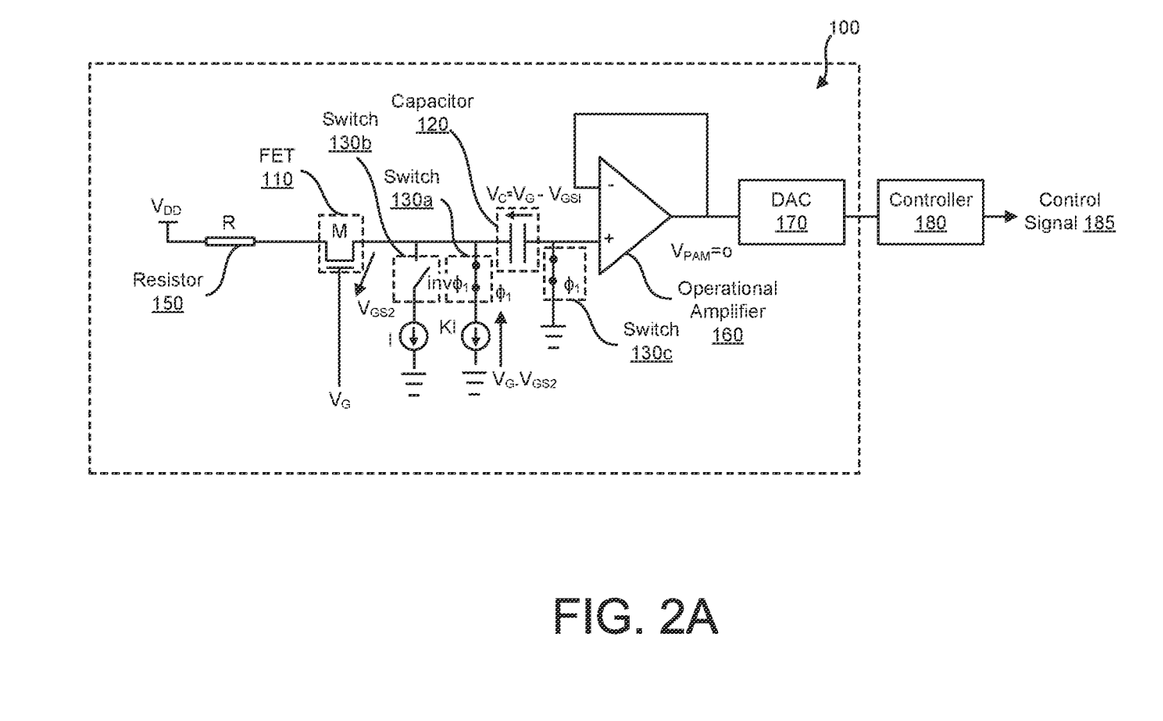
FIG. 2A depicts a schematic diagram illustrating another example of a temperature measurement circuit, in accordance with some example embodiments.
Figure 2B:
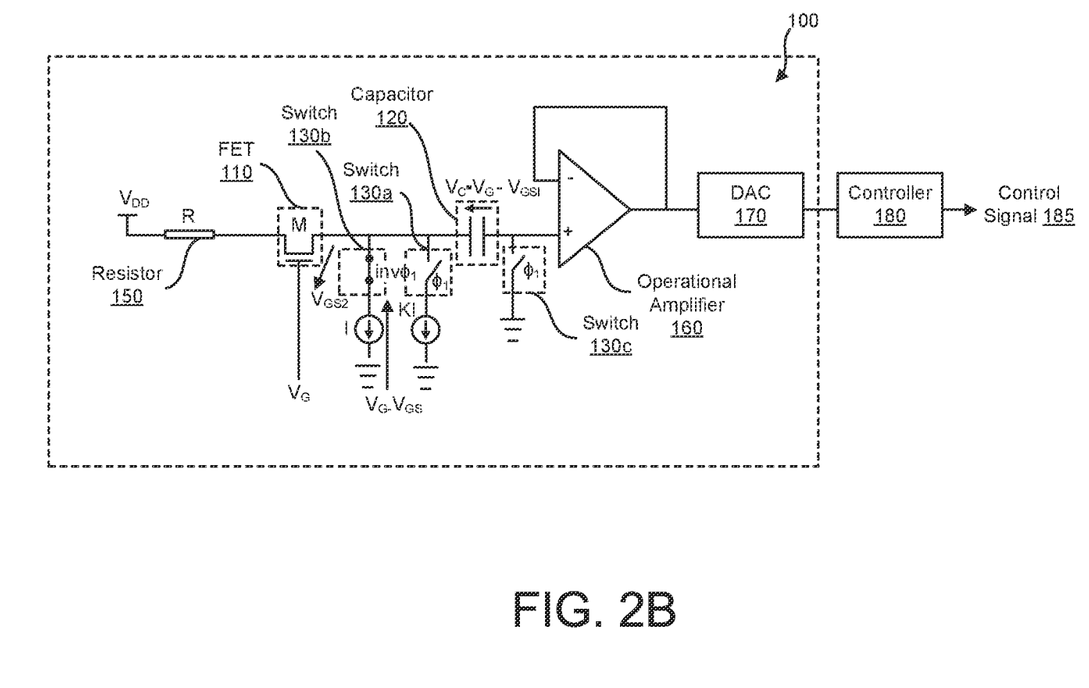
FIG. 2B depicts a schematic diagram illustrating another example of a temperature measurement circuit, in accordance with some example embodiments.

FIGS. 2A-B depicts a schematic diagram illustrating another example of the temperature measurement circuit 100, in accordance with some example embodiments. FIG. 2A depicts the temperature measurement circuit 100 during the first phase of a measurement cycle when the first switch 130a and the third switch 130c are closed in response to the first signal $\phi_1$ but the second switch 130b is open. Meanwhile, FIG. 2B depicts the temperature measurement circuit 100 during the second phase of the measurement cycle when the second switch 130b is closed in response to the second signal $\text{inv}\phi_1$ but the first switch 130a and the third switch 130c are open.

In the example shown in FIGS. 2A-B, the drain terminal of the transistor 110 may be coupled to a direct current (DC) power supply $V_{DD}$ through the resistor 150, which may be disposed between the power supply $V_{DD}$ and the drain terminal of the transistor 110. That is, a first port of the resistor 150 may be coupled with the power supply $V_{DD}$ while a second port of the resistor 150 may be coupled with the drain terminal of the transistor 110. The source terminal of the transistor 110 may be coupled in series to the capacitor 120, the first switch 130a, and the second switch 130b. As shown in FIGS. 2A-B, the first switch 130a and the second switch 130b may be disposed between the source terminal of the transistor 110 and one terminal of the capacitor 110 while the other terminal of the capacitor 110 may be connected to the third switch 130c and the input terminal of the operational amplifier 160. The first switch 130a and the second switch 130b may each have a terminal that is coupled to a current source providing the first bias current KI and the second bias current I.

The example of the temperature measurement circuit 100 shown in FIGS. 2A-B may also be configured to perform temperature measurements over successive measurement cycles, each of which including two phases. During the first phase of a measurement cycle, the first bias current KI may generate the first gate-to-source voltage $V_{GS1}$ at the transistor 110 while the first switch 130a and the third switch 130c are closed but the second switch 130b is open. With the first switch 130a and the third switch 130c closed, the capacitor 120 may be charged to the voltage $V_G - V_{GS1}$ corresponding to a difference between the voltage $V_G$ applied at the gate of the transistor 110 and the first gate-to-source voltage $V_{GS1}$ of the transistor 110. Accordingly, at the conclusion of the first phase of the measurement cycle, the voltage $V_G - V_{GS1}$ may be stored at the capacitor 120. Furthermore, the output of the operational amplifier 160 may be zero during the first phase of the measurement cycle because the input terminal of the operational amplifier 160 is coupled to ground while the third switch 130c is closed.

During the second phase of the measurement cycle, the second bias current I may generate the second gate-to-source voltage $V_{GS2}$ at the transistor 110 while the second switch 130b is closed but the first switch 130a and the third switch 130b are open. Due to the high input impedance of the operational amplifier 160, current from the transistor 110 may bypass the capacitor 120 during the second phase of the measurement cycle. Accordingly, the capacitor 120 may retain, during the second phase of the measurement cycle, the voltage $V_G - V_{GS1}$ stored in the capacitor 120 during the first phase of the measurement cycle. Moreover, the output of the operational amplifier $V_{PAM}$ during the second phase of the measurement cycle may be the voltage difference $\Delta V_{GS}$ between the first gate-to-source voltage $V_{GS1}$ stored in the capacitor 120 and the second gate-to-source voltage $V_{GS2}$ of the transistor 110.

Figure 3:
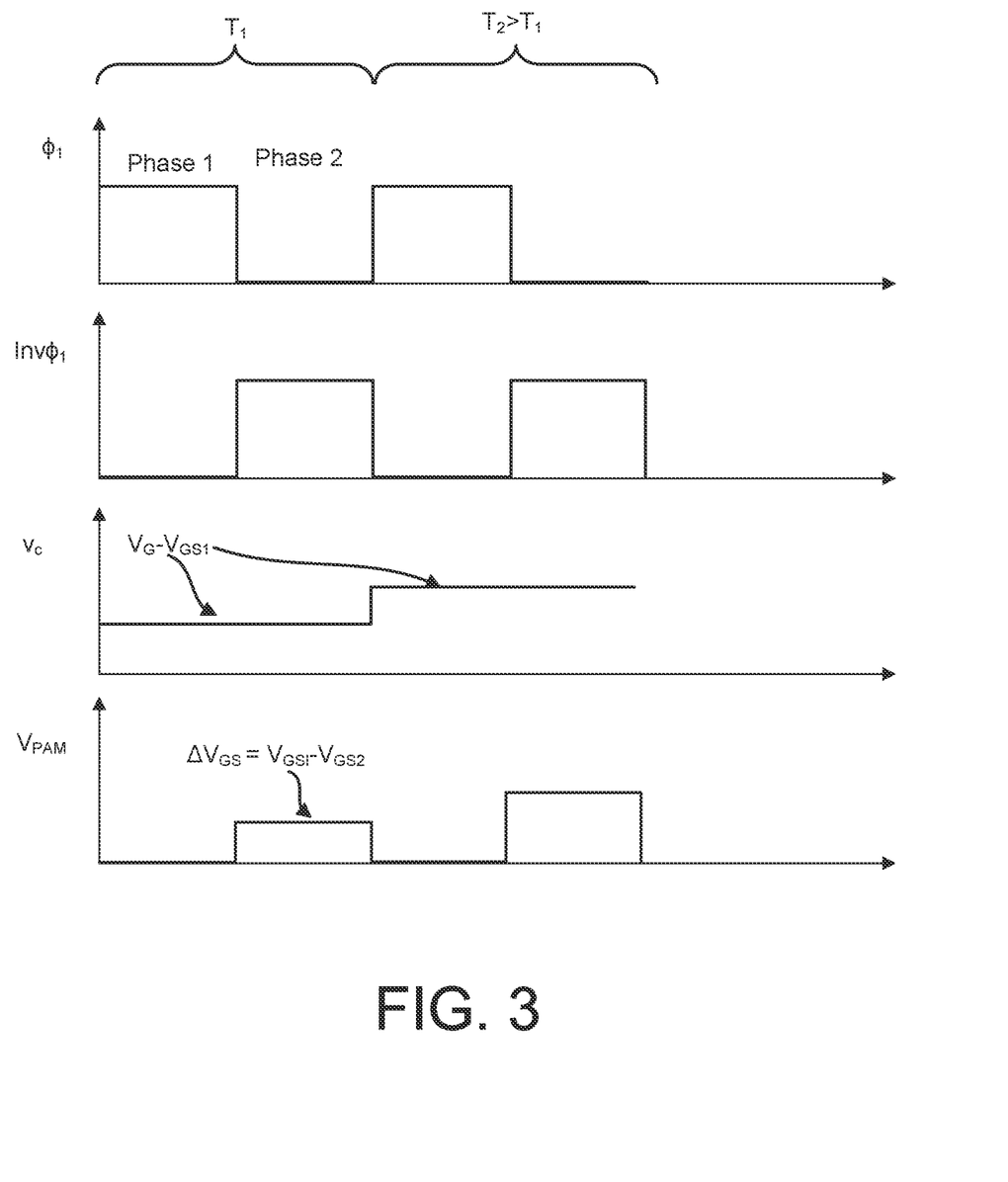
FIG. 3 depicts a timing diagram illustrating a set of signal waveforms associated with a temperature measurement circuit, in accordance with some example embodiments.

FIG. 3 depicts a timing diagram illustrating a set of signal waveforms associated with the temperature measurement circuit 100, in accordance with some example embodiments. As shown in FIG. 3, the first signal $\phi_1$ controlling the first switch 130a and the third switch 130c may be high during the first phase of a measurement cycle and low during the second phase of the measurement cycle. Contrastingly, the second signal $\text{inv}\phi_1$ controlling the second switch 130b may be low during the first phase of the measurement cycle and high during the second phase of the measurement cycle. Accordingly, the first switch 130a and the third switch 130c may be closed during the first phase of the measurement cycle while the second switch 130b may be closed during the second phase of the measurement signal.

Referring again to FIG. 3, the voltage $V_C$ of the capacitor 120, which corresponds to a difference between the voltage $V_G$ applied to the gate of the transistor 110 and the first gate-to-source voltage $V_{GS1}$ at the transistor 110, may further correspond to the temperature T of the transistor 110. For example, as shown in FIG. 3, the voltage $V_C$ of the capacitor 120 may increase as the temperature of the transistor 110 increases from a first temperature $T_1$ to a second temperature $T_2$.

As shown in FIG. 3, the output of the operational amplifier 160 $V_{PAM}$ may be zero during the first phase of the measurement cycle. This is because the input terminal of the operational amplifier 160 is coupled to ground while the third switch 130c is closed during the first phase of the measurement cycle. The output of the operational amplifier $V_{PAM}$ during the second phase of the measurement cycle may be the voltage difference $\Delta V_{GS}$ between the first gate-to-source voltage $V_{GS1}$ stored in the capacitor 120 and the second gate-to-source voltage $V_{GS2}$ of the transistor 110. As shown in FIG. 4, the temperature T of the transistor 110 may be directly proportional the voltage difference $\Delta V_{GS}$. This relationship between the temperature T of the transistor 110 and the voltage difference $\Delta V_{GS}$ is further depicted in FIG. 3, which shows the output of the operational amplifier $V_{PAM}$ being lower when the transistor 110 is at the first temperature $T_1$ and the output the output of the operational amplifier $V_{PAM}$ being higher when the transistor 110 is at the second temperature $T_2$.

Figure 5A:
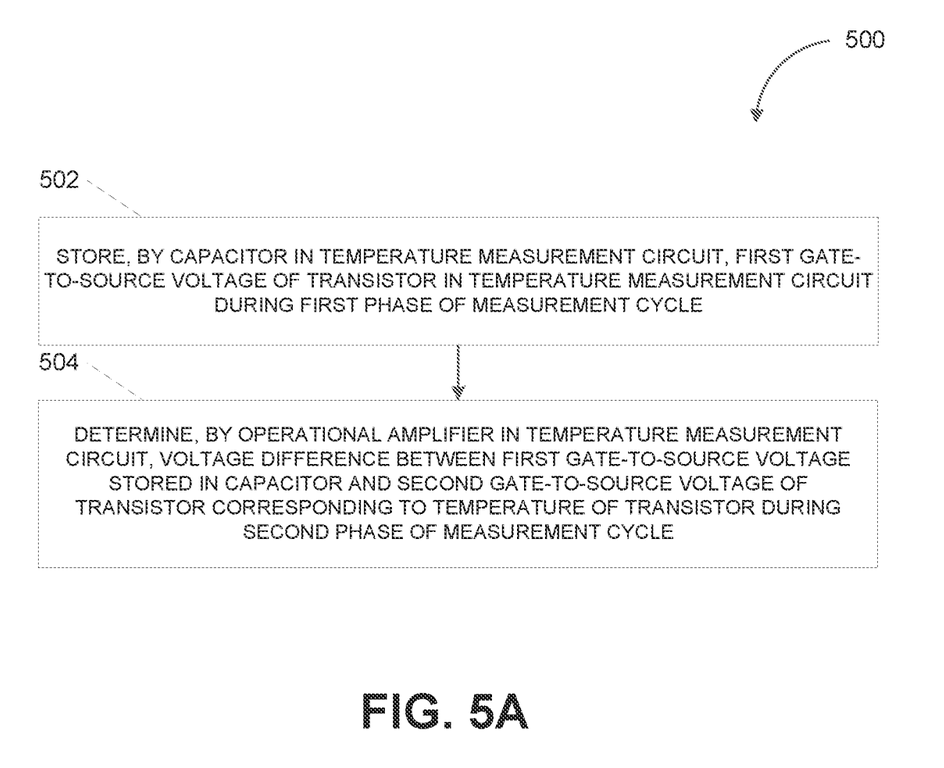
FIG. 5A depicts a flowchart illustrating an example of a process for performing a temperature measurement, in accordance with some example embodiments.

FIG. 5A depicts a flowchart illustrating an example of a process 500 for performing a temperature measurement, in accordance with some example embodiments. Referring to FIGS. 1, 2A-B, and 5A, the process 500 may be performed, for example, by the temperature measurement circuit 100.

At 502, the capacitor 120 in the temperature measurement circuit 100 may store, during a first phase of a measurement cycle, a first gate-to-source voltage $V_{GS1}$ of the transistor 110 in the temperature measurement circuit 100. For example, during the first phase of a measurement cycle, the first switch 130a and the third switch 130c may be closed while the second switch 130b may be open. With the first switch 130a and the third switch 130c closed, the first bias current KI may generate the first gate-to-source voltage $V_{GS1}$ at the transistor 110. Moreover, the capacitor 120 may be charged to the voltage $V_G - V_{GS1}$ corresponding to a difference between the voltage $V_G$ applied at the gate of the transistor 110 and the first gate-to-source voltage $V_{GS1}$ of the transistor 110. Accordingly, at the conclusion of the first phase of the measurement cycle, the voltage $V_G - V_{GS1}$ may be stored at the capacitor 120. Meanwhile, the output of the operational amplifier 160 may be zero during the first phase of the measurement cycle because the input terminal of the operational amplifier 160 is coupled to ground while the third switch 130c is closed.

At 504, the operational amplifier 160 in the temperature measurement circuit 100 may determine, during a second phase of the measurement cycle, a voltage difference $\Delta V_{GS}$ between the first gate-to-source voltage $V_{GS1}$ stored in the capacitor and a second gate-to-source voltage $V_{GS2}$ of the transistor 110 that corresponds to a temperature of the transistor 110. For example, during the second phase of the measurement cycle, the second bias current I may generate a second gate-to-source voltage $V_{GS2}$ at the transistor 110 while the second switch 130b is closed in response to the second signal $inv\phi_1$ but the first switch 130a and the third switch 130b are open. The high input impedance of the operational amplifier 160 may cause current from the transistor 110 to bypass the capacitor 120 during the second phase of the measurement cycle. As such, the capacitor 120 may retain, during the second phase of the measurement cycle, the voltage $V_G - V_{GS1}$ stored in the capacitor 120 during the first phase of the measurement cycle. Moreover, the output of the operational amplifier $V_{PAM}$ during the second phase of the measurement cycle may be the voltage difference $\Delta V_{GS}$ between the first gate-to-source voltage $V_{GS1}$ stored in the capacitor 120 and the second gate-to-source voltage $V_{GS2}$ of the transistor 110.

Figure 5B:
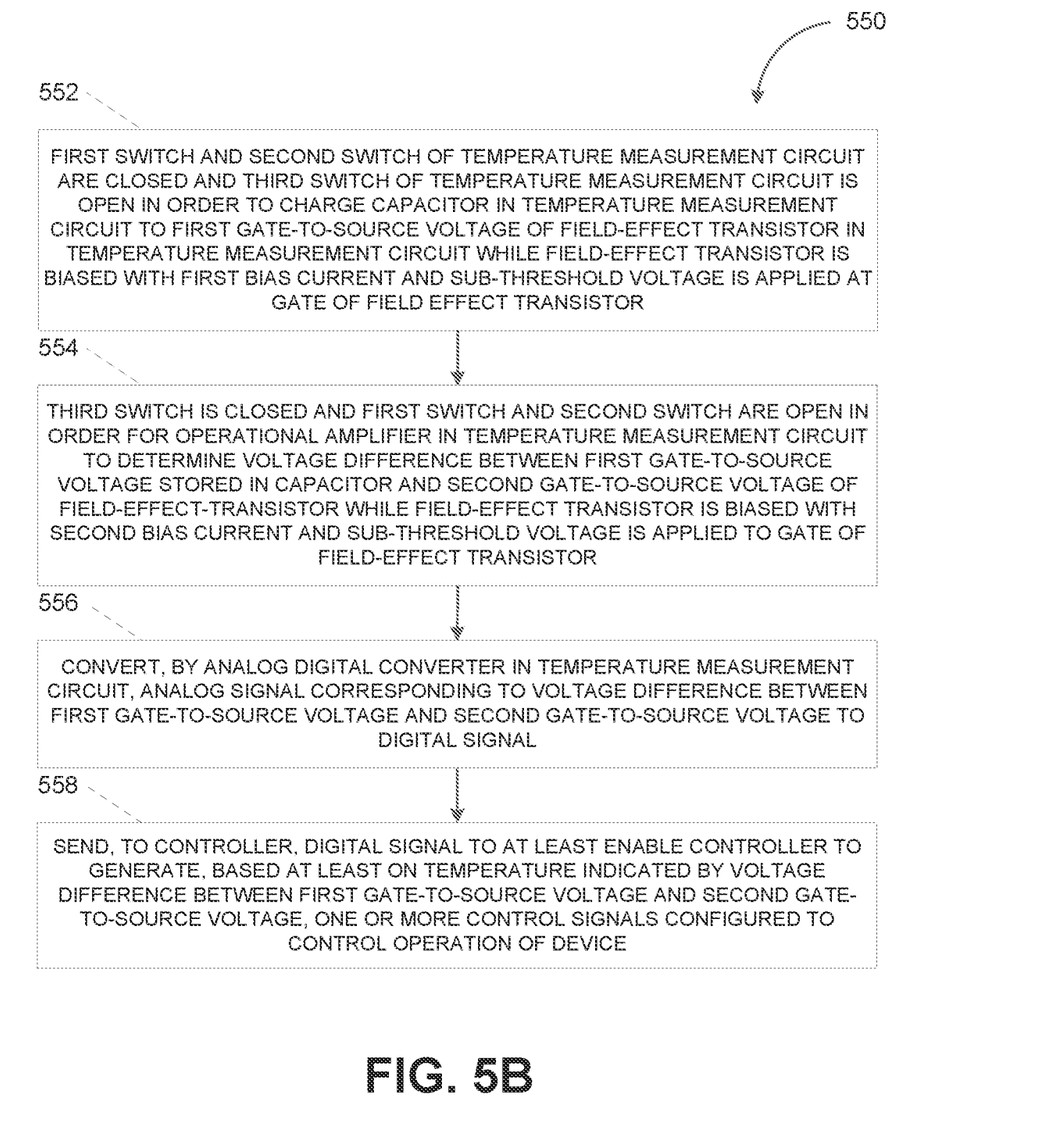
FIG. 5B depicts a flowchart illustrating another example of a process for performing a temperature measurement, in accordance with some example embodiments.

FIG. 5B depicts a flowchart illustrating an example of a process 550 for performing a temperature measurement, in accordance with some example embodiments. Referring to FIGS. 1, 2A-B, and 5B, the process 550 may be performed, for example, by the temperature measurement circuit 100.

At 552, the first switch 130a and the third switch 130c of the temperature measurement circuit 100 may be closed and the second switch 130b of the temperature measurement circuit 100 may be open in order to charge the capacitor 120 in the temperature measurement circuit 100 to a first gate-to-source voltage $V_{GS1}$ of the transistor 110 in the temperature measurement circuit 100 while the transistor 100 is biased with a first bias current KI and a sub-threshold voltage $V_G < V_{th}$ is applied at the gate of the transistor 110. For example, as shown in FIGS. 1 and 2A-B, the temperature control circuit 100 may include the transistor 110, the capacitor 120, the first switch 130a, the second switch 130b, and the third switch 130c.

The temperature measurement circuit 100 may, as noted, perform temperature measurements in successive measurement cycles, each of which including two phases. During the first phase of a measurement cycle, the first switch 130a and the third switch 130c may be closed while the second switch 130b may be open. With the first switch 130a and the third switch 130c closed, the first bias current KI may generate the first gate-to-source voltage $V_{GS1}$ at the transistor 110. Moreover, the capacitor 120 may be charged to the voltage $V_G - V_{GS1}$ corresponding to a difference between the voltage $V_G$ applied at the gate of the transistor 110 and the first gate-to-source voltage $V_{GS1}$ of the transistor 110. Accordingly, at the conclusion of the first phase of the measurement cycle, the voltage $V_G - V_{GS1}$ may be stored at the capacitor 120. Meanwhile, the output of the operational amplifier 160 may be zero during the first phase of the measurement cycle because the input terminal of the operational amplifier 160 is coupled to ground while the third switch 130c is closed.

At 554, the second switch 130b may be closed and the first switch 130a and the third switch 130c may be open in order for the operational amplifier 160 in the temperature measurement circuit 100 to determine a voltage difference $\Delta V_{GS}$ between the first gate-to-source voltage $V_{GS1}$ of the transistor 110 stored in the capacitor 120 and a second gate-to-source voltage $V_{GS2}$ of the transistor 110 while the transistor 110 is biased with a second bias current I and the sub-threshold voltage $V_G < V_{th}$ is applied at the gate of the transistor 110. For instance, during the second phase of the measurement cycle, the second bias current I may generate a second gate-to-source voltage $V_{GS2}$ at the transistor 110 while the second switch 130b is closed in response to the second signal $inv\phi_1$ but the first switch 130a and the third switch 130b are open. The high input impedance of the operational amplifier 160 may cause current from the transistor 110 to bypass the capacitor 120 during the second phase of the measurement cycle. As such, the capacitor 120 may retain, during the second phase of the measurement cycle, the voltage $V_G - V_{GS1}$ stored in the capacitor 120 during the first phase of the measurement cycle. Moreover, the output of the operational amplifier $V_{PAM}$ during the second phase of the measurement cycle may be the voltage difference $\Delta V_{GS}$ between the first gate-to-source voltage $V_{GS1}$ stored in the capacitor 120 and the second gate-to-source voltage $V_{GS2}$ of the transistor 110.

At 556, the analog-to-digital converter 170 in the temperature measurement circuit 100 may convert, to a digital signal, an analog signal corresponding to the voltage difference $\Delta V_{GS}$ between the first gate-to-source voltage $V_{GS1}$ and the second gate-to-source voltage $V_{GS2}$. As shown in FIGS.

1 and 2A-B, the temperature measurement circuit 100 may further include the analog-to-digital converter 170. In some example embodiments, the output of the operational amplifier $V_{PAM}$ may be a pulse-amplitude-modulated (PAM) signal. As such, the analog-to-digital converter 170 may be configured to convert the pulse-amplitude-modulated signal output by the operational amplifier 160 into a digital signal conveying the voltage difference S $V_{GS}$ between the first gate-to-source voltage $V_{GS1}$ stored in the capacitor 120 and the second gate-to-source voltage $V_{GS2}$ of the transistor 110. Moreover, as noted, the voltage difference $\Delta V_{GS}$ between the first gate-to-source voltage $V_{GS1}$ stored in the capacitor 120 and the second gate-to-source voltage $V_{GS2}$ of the transistor 110 may be directly proportional to the temperature T of the transistor 110. Accordingly, it should be appreciated that the digital signal output by the analog-to-digital converter 170 may be indicative of the temperature at the transistor 110.

At 558, the temperature measurement circuit 100 may send, to the controller 180, the digital signal to at least enable the controller 180 to generate, based at least on a temperature indicated by the voltage difference $\Delta V_{GS}$ between the first gate-to-source voltage $V_{GS1}$ and the second gate-to-source voltage $V_{GS2}$, the control signal 185 configured to control an operation of a device. For example, the temperature measurement circuit 100 may be communicatively coupled, via wired connection and/or a wireless connection, to the controller 180. The digital signal output by the analog-to-digital converter 170 may be sent to the controller 180 such that the controller 180 may determine, based on the voltage difference $\Delta V_{GS}$ conveyed in the digital signal, the temperature T of the transistor 110. For instance, the temperature T of the transistor 110 may be determined based at least on the linear relationship that exists between the temperature T of the transistor 110 and the voltage difference $\Delta V_{GS}$. The controller 180 may be configured to generate, based at least on the temperature T, the control signal 185, which may be configured to control the operations of a device such as, for example, a wearable device, an Internet-of-Things device, and/or the like.

Figure 6:
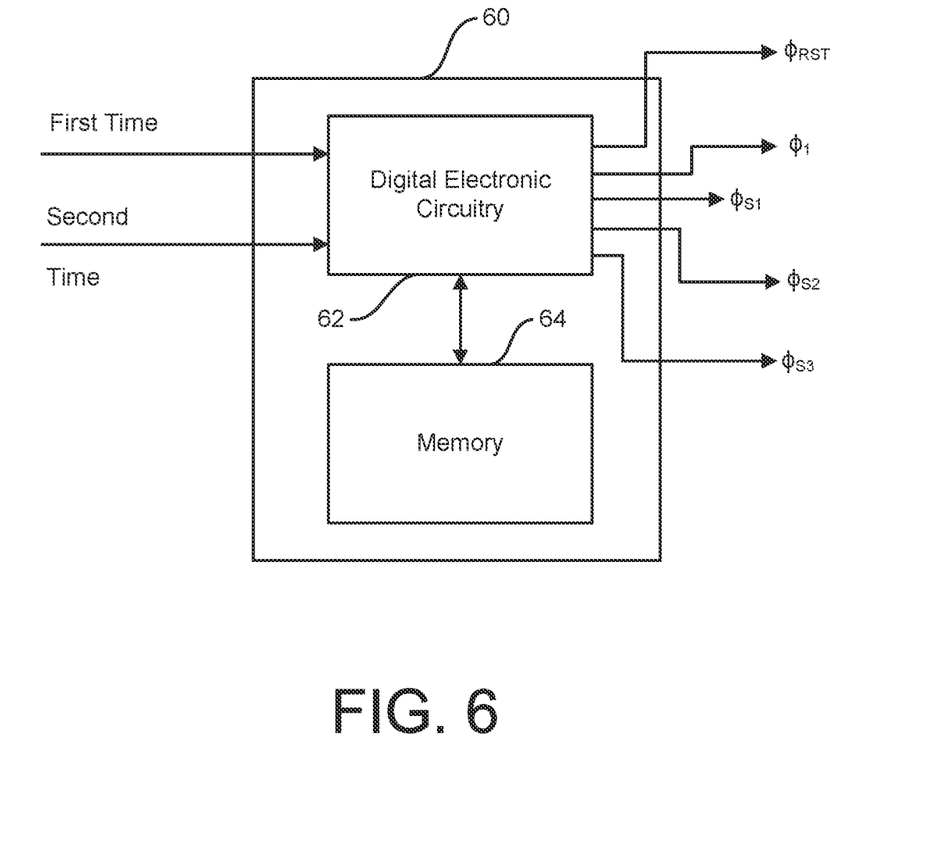
FIG. 6 depicts a block diagram illustrating an example of a device, in accordance with some example embodiments.

FIG. 6 depicts a block diagram illustrating an example of a device 60, in accordance with some example embodiments. Referring to FIG. 6, the device 60 may include, is associated with, and/or is communicatively coupled with the controller 180 and/or the temperature measurement circuit 100 shown, for example, in FIGS. 1 and 2A-B. One or more operations of the device 60 may be controlled by the control signal 185, which is generated by the controller 180 based on the temperature measurements made by the temperature measurement circuit 100.

In some example embodiments, the device 60 may be embodied as a computer, a mobile terminal, such as a personal digital assistant (PDA), mobile telephone, smart phone, wearable device, smart watch or a tablet computer, or a fixed computing device, such as a computer workstation or the like. As shown, the device 60 may further include, be associated with, or be in communication with a processing circuitry 62 and a memory device 64. The digital electronic circuitry 62 may be in communication with the memory device 64 via a bus for passing information among components of the apparatus. The memory device 64 may be non-transitory and may include, for example, one or more volatile and/or non-volatile memories. In other words, for example, the memory device 64 may be an electronic storage device (e.g., a computer readable storage medium) comprising gates configured to store data (e.g., bits) that may be retrievable by a machine (e.g., a computing device like the digital electronic circuitry). The memory device 64 may be configured to store information, data, content, applications, instructions, or the like for enabling the device 60 to carry out various functions in accordance with various embodiments of the present disclosure. For example, the memory device 64 could be configured to buffer input data for processing by the digital electronic circuitry. Additionally or alternatively, the memory device 64 could be configured to store instructions for execution by the digital electronic circuitry 62.

The device 60 may, in some embodiments, be embodied in various computers as described above. However, in some embodiments, the device 60 may be embodied as a chip or chip set. In other words, the device 60 may comprise one or more physical packages (e.g., chips) including materials, components and/or wires on a structural assembly (e.g., a baseboard). The structural assembly may provide physical strength, conservation of size, and/or limitation of electrical interaction for component circuitry included thereon. The device 60 may therefore, in some cases, be configured to implement various embodiments of the present disclosure on a single chip or as a single "system on a chip." As such, in some cases, a chip or chipset may constitute means for performing one or more operations for providing the functionalities described herein.

The digital electronic circuitry 62 may be embodied in a number of different ways. For example, the digital electronic circuitry 62 may be embodied as one or more of various hardware processing means such as a coprocessor, a microprocessor, a controller, a digital signal processor (DSP), a processing element with or without an accompanying DSP, or various other circuitry including integrated circuits such as, for example, an application specific integrated circuit (ASIC), an field programmable gate array (FPGA), a microcontroller unit (MCU), a hardware accelerator, a special-purpose computer chip, and/or the like. As such, in some embodiments, the digital electronic circuitry 62 may include one or more processing cores configured to perform independently. A multi-core digital electronic circuitry may enable multiprocessing within a single physical package. Additionally or alternatively, the digital electronic circuitry 62 may include one or more processors configured in tandem via the bus to enable independent execution of instructions, pipelining and/or multithreading. Accordingly, blocks of the flowchart support combinations of means for performing the specified functions and combinations of operations for performing the specified functions. It will also be understood that one or more blocks of the flowchart, and combinations of blocks in the flowchart, can be implemented by special purpose hardware-based computer systems which perform the specified functions, or combinations of special purpose hardware and computer instructions.

In an example embodiment, the digital electronic circuitry 62 may be configured to execute instructions stored in the memory device 64 or otherwise accessible to the digital electronic circuitry 62. Alternatively or additionally, the digital electronic circuitry 62 may be configured to execute hard coded functionality. As such, whether configured by hardware or software methods, or by a combination thereof, the digital electronic circuitry 62 may represent an entity (e.g., physically embodied in circuitry) capable of performing operations according to various embodiments of the present disclosure while configured accordingly. Thus, for example, when the digital electronic circuitry 62 is embodied as an ASIC, FPGA, or the like, the digital electronic circuitry 62 may be specifically configured hardware for conducting the operations described herein. Alternatively, as another example, when the digital electronic circuitry 62 is embodied as an executor of instructions, the instructions may specifically configure the digital electronic circuitry 62 to perform the algorithms and/or operations described herein when the instructions are executed. However, in some cases, the digital electronic circuitry 62 may be a processor of a specific device (e.g., an image or video processing system) configured to employ various embodiments of the present disclosure by further configuration of the digital electronic circuitry 62 by instructions for performing the algorithms and/or operations described herein. The digital electronic circuitry 62 may include, among other things, a clock, an arithmetic logic unit (ALU) and logic gates configured to support the operations of the digital electronic circuitry 62.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural and/or object-oriented programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively, or additionally, store such machine instructions in a transient manner, such as for example, as would a processor cache or other random access memory associated with one or more physical processor cores.

To provide for interaction with a user, one or more aspects or features of the subject matter described herein can be implemented on a computer having a display device, such as for example a cathode ray tube (CRT) or a liquid crystal display (LCD) or a light emitting diode (LED) monitor for displaying information to the user and a keyboard and a pointing device, such as for example a mouse or a trackball, by which the user may provide input to the computer. Other kinds of devices can be used to provide for interaction with a user as well. For example, feedback provided to the user can be any form of sensory feedback, such as for example visual feedback, auditory feedback, or tactile feedback; and input from the user may be received in any form, including, for example, acoustic, speech, tactile, and/or the like. Other possible input devices include, for example, touch screens or other touch-sensitive devices such as single or multi-point resistive or capacitive track pads, voice recognition hardware and software, optical scanners, optical pointers, digital image capture devices and associated interpretation software, and the like.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. An apparatus, comprising:
   a transistor;
   a capacitor configured to store a first gate-to-source voltage of the transistor during a first phase of a measurement cycle;
   an operational amplifier configured to determine a voltage difference between the first gate-to-source voltage stored in the capacitor and a second gate-to-source voltage of the transistor during a second phase of the measurement cycle, the voltage difference corresponding to a temperature of the transistor; and
   first, second and third switches, wherein the first switch and the second switch are coupled in series to a source terminal of the transistor or a drain terminal of the transistor, wherein the source terminal of the transistor is coupled in series to a first terminal of the capacitor, wherein the third switch is disposed between a second terminal of the capacitor and ground, and wherein the first and third switches are closed and the second switch is open during the first phase of the measurement cycle and the first and third switches are open and the second switch is closed during the second phase of the measurement cycle.

2. An apparatus according to claim 1, wherein the capacitor is charged to the first gate-to-source voltage of the transistor during the first phase of the measurement cycle, wherein the transistor is biased with a first bias current during the first phase of the measurement cycle.

3. An apparatus according to claim 2, wherein the transistor is biased with a second bias current during the second phase of the measurement cycle.

4. An apparatus according to claim 1, wherein the second terminal of the capacitor is further coupled in series to an input terminal of the operational amplifier.

5. An apparatus according to claim 4, wherein the capacitor forms a parallel connection with a resistor while the first switch and the second switch are closed.

6. An apparatus according to claim 5, wherein the resistor is disposed between the transistor and the capacitor, wherein a first port of the resistor is coupled with the source terminal of the transistor and the first terminal of the capacitor, and wherein a second port of the resistor is coupled to ground.

7. An apparatus according to claim 5, wherein a first port of the resistor is coupled in series to the drain terminal of the transistor, and wherein a second port of the resistor is coupled in series to a power supply of the apparatus.

8. An apparatus according to claim 1, wherein the transistor comprises a metal oxide semiconductor field-effect transistor.

9. An apparatus according to claim 1, wherein a sub-threshold voltage is applied to between a gate and a source terminal of the transistor, and wherein the sub-threshold voltage comprises a voltage that is less than a minimum voltage associated with creating a conductive path between the source terminal of the transistor and a drain terminal of the transistor.

10. An apparatus according to claim 1, wherein an output of the operational amplifier comprises a pulse amplitude modulated signal, and wherein the apparatus further comprises an analog to digital converter configured to convert, to a digital signal, the pulse amplitude modulated signal.

11. An apparatus according to claim 10, wherein the digital signal is sent, via a wired connection and/or a wireless connection, to a controller of a device, and wherein the digital signal is sent to the controller to at least enable the controller to determine, based at least on the digital signal, one or more temperatures of the transistor and generate, based at least on the one or more temperatures, a control signal configured to control an operation of the device.

12. A method, comprising:
storing, by a capacitor, a first gate-to-source voltage of a transistor during a first phase of a measurement cycle; and
determining, by an operational amplifier, a voltage difference between the first gate-to-source voltage stored in the capacitor and a second gate-to-source voltage of the transistor during a second phase of the measurement cycle, the voltage difference corresponding to a temperature of the transistor,
wherein first and third switches are closed and a second switch is open during the first phase of the measurement cycle, wherein the first switch and the second switch are coupled in series to a source terminal of the transistor or a drain terminal of the transistor, wherein the source terminal of the transistor is coupled in series to a first terminal of the capacitor, wherein the third switch is disposed between a second terminal of the capacitor and ground, and
wherein the first and third switches are open and the second switch is closed during the second phase of the measurement cycle.

13. A method according to claim 12, further comprising:
biasing the transistor with a first bias current during the first phase of the measurement cycle; and
biasing the transistor with a second bias current during the second phase of the measurement cycle, the first bias current being greater in magnitude than the second bias current by an integer multiplier.

14. A method according to claim 12 further comprising:
converting, by an analog to digital converter, a pulse amplitude modulated signal output by the operational amplifier to a digital signal.

15. A method according to claim 14 further comprising:
sending, via a wired connection and/or a wireless connection, the digital signal to a controller of a device, the digital signal being sent to the controller to at least enable the controller to determine, based at least on the digital signal, one or more temperatures of the transistor and generate, based at least on the one or more temperatures, a control signal configured to control an operation of the device.

16. A non-transitory computer readable medium comprising program instructions for causing an apparatus to perform at least the following:
store, by a capacitor, a first gate-to-source voltage of a transistor during a first phase of a measurement cycle; and
determine, by an operational amplifier, a voltage difference between the first gate-to-source voltage stored in the capacitor and a second gate-to-source voltage of the transistor during a second phase of the measurement cycle, the voltage difference corresponding to a temperature of the transistor,
wherein first and third switches are closed and a second switch is open during the first phase of the measurement cycle, wherein the first switch and the second switch are coupled in series to a source terminal of the transistor or a drain terminal of the transistor, wherein the source terminal of the transistor is coupled in series to a first terminal of the capacitor, wherein the third switch is disposed between a second terminal of the capacitor and ground, and
wherein the first and third switches are open and the second switch is closed during the second phase of the measurement cycle.

17. A non-transitory computer readable medium according to claim 16, wherein the computer program instructions further comprise instructions for causing the apparatus to perform at least the following:
bias the transistor with a first bias current during the first phase of the measurement cycle; and
bias the transistor with a second bias current during the second phase of the measurement cycle, the first bias current being greater in magnitude than the second bias current by an integer multiplier.

18. A non-transitory computer readable medium according to claim 16, wherein the computer program instructions further comprise instructions for causing the apparatus to perform at least the following:
convert, by an analog to digital converter, a pulse amplitude modulated signal output by the operational amplifier to a digital signal.

19. A computer program product according to claim 18, wherein the computer program instructions further comprise instructions for causing the apparatus to perform at least the following:
send, via a wired connection and/or a wireless connection, the digital signal to a controller of a device, the digital signal being sent to the controller to at least enable the controller to determine, based at least on the digital signal, one or more temperatures of the transistor and generate, based at least on the one or more temperatures, a control signal configured to control an operation of the device.

* * * * *

UNITED STATES PATENT AND TRADEMARK OFFICE
CERTIFICATE OF CORRECTION

PATENT NO. : 12,123,787 B2
APPLICATION NO. : 17/145867
DATED : October 22, 2024
INVENTOR(S) : Marijan Herceg et al.

Page 1 of 1

It is certified that error appears in the above-identified patent and that said Letters Patent is hereby corrected as shown below:

In the Claims

In Column 16, Line 53, Claim 19, delete "computer program product" and insert -- non-transitory computer readable medium --, therefor.

Signed and Sealed this
Eighth Day of April, 2025

Coke Morgan Stewart
*Acting Director of the United States Patent and Trademark Office*